US010950294B2

(12) United States Patent
Suzuki et al.

(10) Patent No.: US 10,950,294 B2
(45) Date of Patent: Mar. 16, 2021

(54) APPARATUSES AND METHODS FOR CONTROLLING DRIVING SIGNALS IN SEMICONDUCTOR DEVICES INCLUDING WORD AND SUBWORD DRIVER CIRCUITS

(71) Applicant: MICRON TECHNOLOGY, INC., Boise, ID (US)

(72) Inventors: Takamasa Suzuki, Hachioji (JP); Nobuo Yamamoto, Nerima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/393,719

(22) Filed: Apr. 24, 2019

(65) Prior Publication Data
US 2020/0342929 A1    Oct. 29, 2020

(51) Int. Cl.
*G11C 11/408* (2006.01)
*G11C 8/08* (2006.01)
*G11C 11/4074* (2006.01)
*G11C 7/00* (2006.01)

(52) U.S. Cl.
CPC ........... *G11C 11/4085* (2013.01); *G11C 7/00* (2013.01); *G11C 8/08* (2013.01); *G11C 11/4074* (2013.01); *G11C 11/4087* (2013.01)

(58) Field of Classification Search
CPC ........... G11C 11/4085; G11C 11/4074; G11C 11/4087; G11C 7/00; G11C 8/08
See application file for complete search history.

(56) References Cited

U.S. PATENT DOCUMENTS

| 8,363,507 B2 * | 1/2013 | Cho ........................ G11C 8/08 |
| | | 365/230.06 |
| 2011/0176375 A1 * | 7/2011 | Lee ........................ G11C 8/08 |
| | | 365/194 |
| 2019/0080736 A1 * | 3/2019 | Baeck ..................... G11C 8/08 |

* cited by examiner

*Primary Examiner* — Sultana Begum
(74) *Attorney, Agent, or Firm* — Dorsey & Whitney LLP

(57) ABSTRACT

Apparatuses and methods for controlling driving signals are disclosed herein. Word drivers may be included in a memory device for driving hierarchical structured main word lines and subword lines. The subword lines may be driven by subword drivers that are activated by main word drivers and word drivers. In driving the word lines, driving signals are driven between an active state having an active voltage and an inactive state having an inactive voltage. The active voltage may be a voltage of a power supply and the inactive voltage may be an intermediate voltage between the active voltage and a reference voltage, such as ground. Driving the driving signals in such a manner may reduce current consumption of the memory device in some operations, for example, such as refresh operations.

14 Claims, 12 Drawing Sheets

APPARATUSES AND METHODS FOR CONTROLLING DRIVING SIGNALS IN SEMICONDUCTOR DEVICES INCLUDING WORD AND SUBWORD DRIVER CIRCUITS

BACKGROUND

A semiconductor memory device represented by a DRAM (Dynamic Random Access Memory) includes a memory cell array having memory cells disposed at intersections between word lines and bit lines. The semiconductor memory device may include hierarchically structured main word lines and subword lines. The main word line (MWL) is a word line positioned at an upper hierarchy, and is selected by a first portion of a row address. The subword line is a word line positioned at a lower hierarchy, and is selected based on a corresponding main word line and a word driver line (FXL) selected by a second portion of the row address.

A memory cell array included in a semiconductor memory device such as the DRAM may be divided into a plurality of memory mats to reduce the wiring capacitance of the subword lines and the bit lines. Each memory mat includes respective main word lines, so that when the main word line is selected using the first portion of the row address, the memory mat to be selected is also determined at the same time.

The driving process of the subword lines is carried out by subword drivers, and when a subword line is driven to a high level voltage, the memory cell is coupled to the corresponding bit line. On the other hand, during a period in which the subword line is driven to a low level voltage, the memory cell and the bit line are kept in a cut-off state. A low level voltage is associated with a low logic level. In driving subword lines to the high level voltage, relatively high voltages are provided to the subword drivers of a memory mat. A high level voltage is associated with a high logic level. In contrast, in driving the subword line to a low level voltage, relatively low voltages are provided to the subword drivers of the memory mat.

Driving main word lines and word driver lines between the active and inactive states to select subword lines during operation may consume significant current. Reducing current draw during operations would be desirable to reduce overall power consumption during the operations.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

A semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line (MWL) and a word driver line (FXL), which is selected by a second portion of the row address. The MWL may be driven by main word drivers (MWD) and the word driver line FXL may be driven by word drivers (FXD). Both the MWL and FXL must be driven to active states to select the desired subword line in the memory device.

The word drivers (FXD) drive the FXL between active and inactive states to provide driving signals FX. For example, the word drivers (FXD) drives the FXL to an active state having an active voltage and to an inactive state having an inactive voltage. The active voltage may be a voltage of a power supply and the inactive voltage for the FXL may be an intermediate voltage between the active voltage and a reference voltage (e.g., ground). Driving the FXL between the active voltage and the intermediate voltage of the inactive voltage may reduce current consumption of the memory device in some operations, for example, such as refresh operations.

Figure 1:
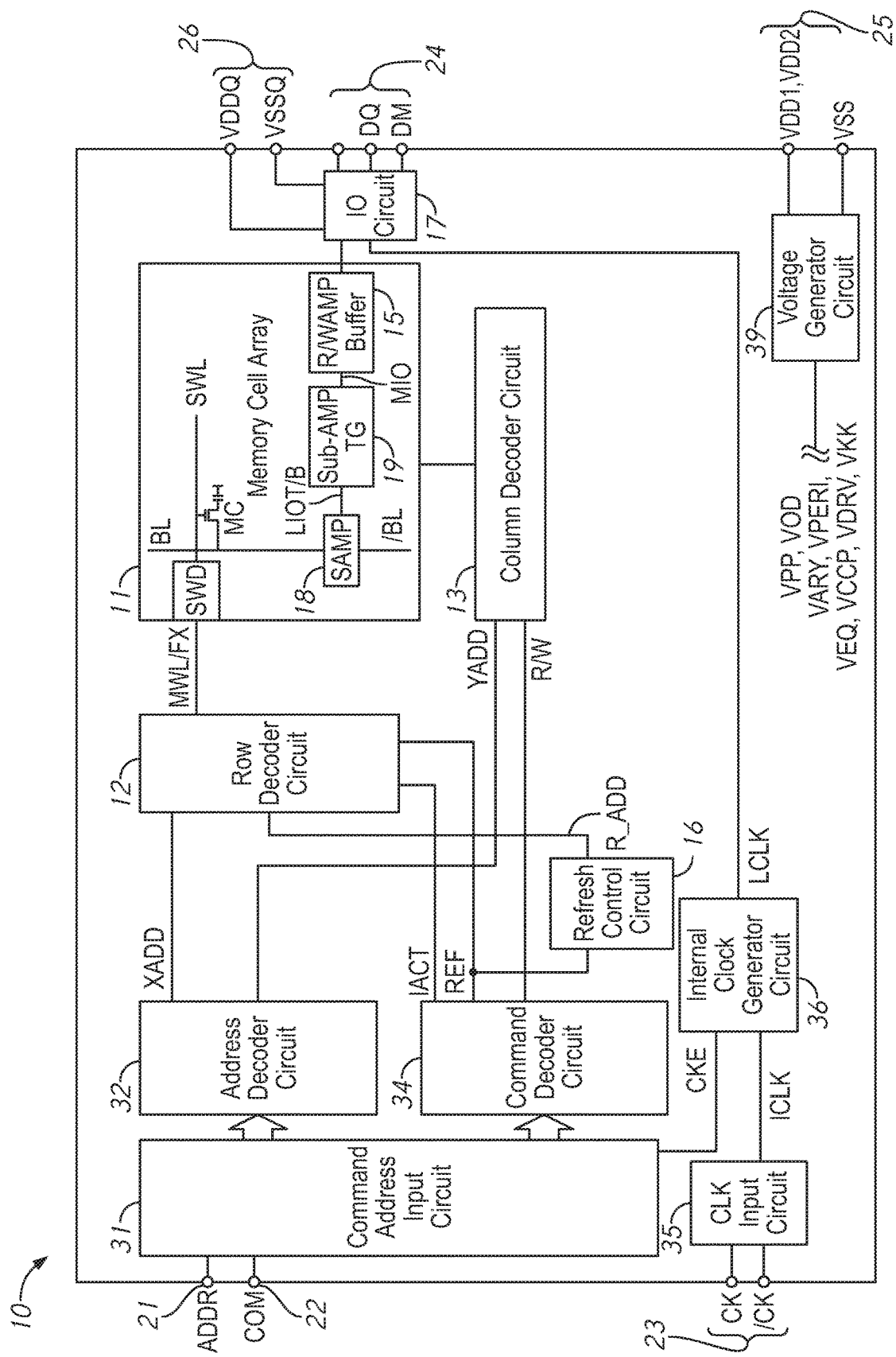
FIG. 1 is a block diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells MC disposed at the intersections. The SWL may be driven by subword drivers SWD. For clarity, only one SWL, SWD, BL, /BL and MC are shown in FIG. 1 although many SWL, SWD, BL, /BL and MC may be included. A plurality of main word lines MWL and word driver lines FXL are coupled between a row decoder circuit 12 and the SWD. The selection of a main word line MWL and a word driver line FXL is carried out by the row decoder circuit 12, and the selection of the bit lines BL and /BL is carried out by a column decoder circuit 13. Sense amplifiers 18 are coupled to corresponding bit lines BL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes address terminals 21, command terminals 22, clock terminals 23, data terminals 24, and power supply terminals 25 and 26.

The address terminals 21 are provided with an address signal ADDR. The address signal ADDR is provided to the address terminals 21 are transferred via a command/address input circuit 31 to an address decoder circuit 32. The address decoder circuit 32 receives the address signal ADDR and supplies a decoded row address signal XADD to the row decoder circuit 12, and a decoded column address signal YADD to the column decoder circuit 13.

The command terminals 22 are provided with a command signal COM. The command signal COM may include one or more separate signals. The command signal COM input to the command terminals 22 is input to a command decoder circuit 34 via the command/address input circuit 31. The command decoder circuit 34 decodes the command signal COM to provide various internal command signals. For example, the command decoder circuit 34 may activate an activation signal IACT in response to an activation command and/or a refresh signal REF in response to a refresh command. For example, the internal commands may include a row command signal to select a word line and a column command signal, such as a read command or a write command, to select a bit line.

When a row activation command is issued and a row address is timely provided with the activation command, and a column address is timely provided with a read command, read data is read from a memory cell MC in the memory cell array 11 designated by the row address and column address. More specifically, the row decoder circuit 12 selects a main word line MWL, word driver line FXL, and subword line SWL indicated by the row address RA indicated by XADD so that the associated memory cell MC is subsequently coupled to the bit line BL. The read data DQ is output externally from the data terminals 24 via a read/write amplifier 15 and an input/output circuit 17. Similarly, when the row activation command is issued and a row address are timely provided with the activation command, and a column address is timely provided with a write command, the input/output circuit 17 may receive write data DQ at the data terminals 24. The write data DQ is provided via the input/output circuit 17 and the read/write amplifier 15 to the memory cell array 11 and written in the memory cell MC designated by the row address and the column address.

The row decoder circuit 12 may include word drivers (FXD) that drive the word driver lines (FXL). The word drivers FXD may receive an activation signal IACT from the command decoder circuit 34 and drive a respective word driver line FXL between active and inactive states to provide driving signals FX. The word driving lines may each include two signal lines and the driving signals may each include driving signals FXT and FXF. The driving signal FXT may be provided on one of the signal lines and the driving signal FXF may be provided on the other signal line. The active state of the FXL may have an active voltage provided by a power supply, for example VCCP. The inactive state may have an inactive voltage that is between the voltage of the power supply and a reference voltage, for example, ground.

The device 10 may include a refresh control circuit 16 for carrying out refresh operations. The refresh operations may be an auto-refresh operation and/or other refresh operations. In some embodiments, a refresh command may be externally issued to the device 10 and provided to the command decoder circuit 34 which provides the refresh command REF to the refresh control circuit 16 and row decoder circuit 12. In some embodiments, the refresh command REF may be periodically provided by a component of the device 10 (e.g., internally by the refresh control circuit 16 or the command decoder circuit 34). The refresh control circuit 16 may provide a refresh address R_ADD to the row decoder circuit 12, which may indicate a row address for performing a refresh operation.

The clock terminals 23 are provided with external clock signals CK and /CK, respectively. The external clock signals CK and /CK are complementary to each other and are provided to a clock input circuit 35. The clock input circuit 35 receives the external clock signals CK and /CK and provides an internal clock signal ICLK. The internal clock signal ICLK is provided to an internal clock generator 36. A phase controlled internal clock signal LCLK is provided based on the received internal clock signal ICLK and a clock enable signal CKE from the command/address input circuit 31. Although not limited thereto, a DLL circuit can be used as the internal clock generator 36. The phase controlled internal clock signal LCLK is provided to the input/output circuit 17 and is used as a timing signal for determining an output timing of the read data DQ.

The power supply terminals 25 are provided with power supply voltages VDD1, VDD2, and VSS. These power supply voltages VDD1, VDD2, and VSS are provided to an internal voltage generator circuit 39. The internal voltage generator circuit 39 provides various internal voltages VPP, VOD, VARY, VPERI, VEQ, VCCP, VDRV, and VKK.

The internal voltages VCCP, VDRV, and VKK are voltages to be mainly used in the row decoder circuit 12. For example, VKK may be used as a low voltage and VCCP may be used as a high voltage in some embodiments. Although the detailed description thereof will be given later, the row decoder circuit 12 drives the main word line MWL and subword line SWL selected based upon the address signal ADDR to a VCCP level corresponding to a high voltage (e.g., 3.1 V) so that a cell transistor of the memory cell MC is turned on.

The internal voltages VARY and VEQ are used by the sense amplifier 18, transfer gates 19 and/or read/write amplifiers 15. When the sense amplifier 18 is activated, the read data read out is amplified by driving one of the paired bit lines to a VARY level with the other one being driven to a VSS level. The internal voltage VPERI is used as a power supply voltage for most of the peripheral circuits, such as the command/address input circuit 31.

The power supply terminals 26 are provided with power supply voltages VDDQ and VSSQ. These power supply voltages VDDQ and VSSQ are provided to the input/output circuit 17. The power supply voltages VDDQ and VSSQ may be the same voltages as the power supply voltages VDD2 and VSS that are provided to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
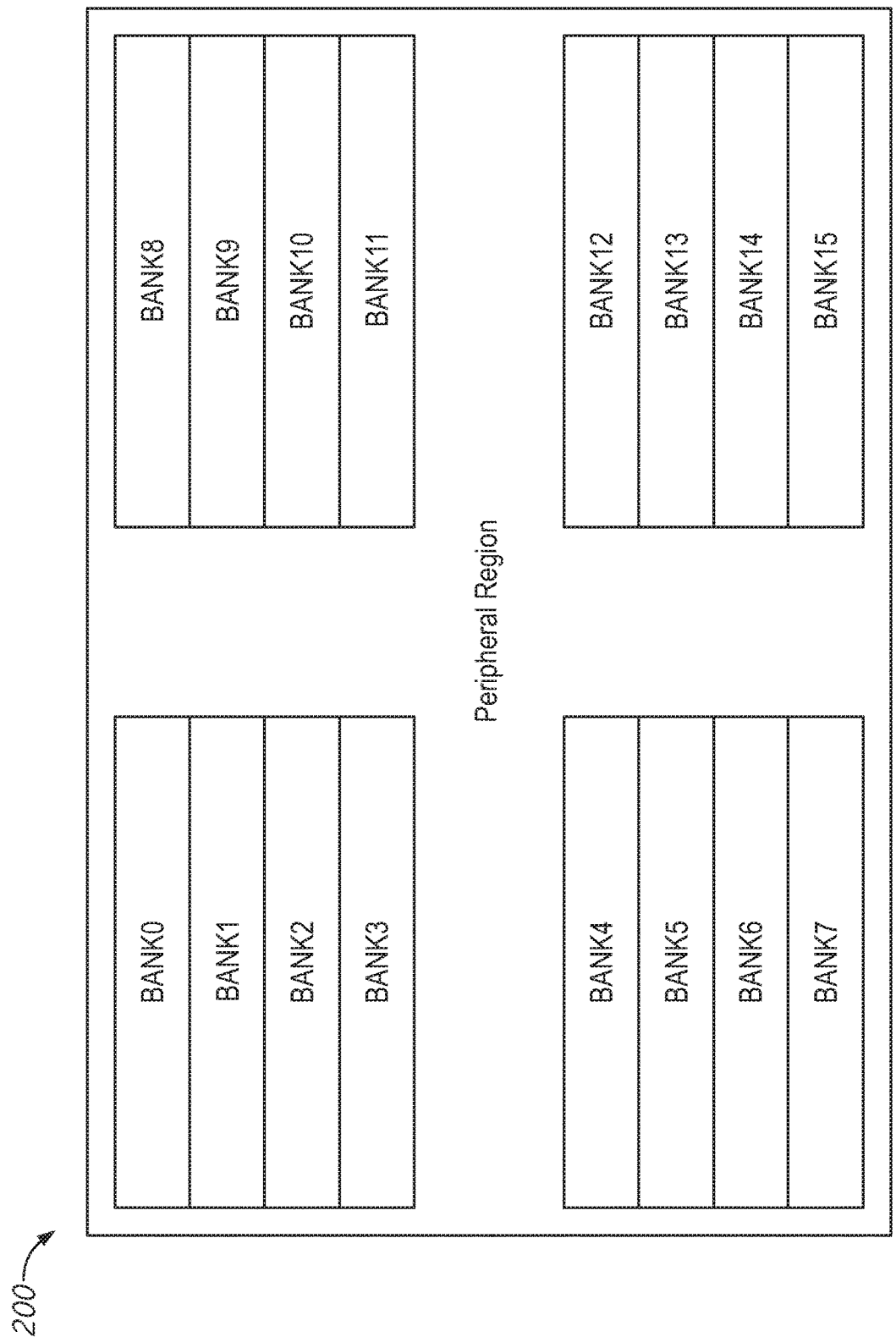
FIG. 2 is a diagram for a layout of a semiconductor device according to an embodiment of the disclosure.

FIG. 2 is a diagram for an example layout of a memory cell array of a semiconductor device according to an embodiment of the disclosure. In some embodiments of the disclosure, the memory cell array may be included in the memory cell array 11 of the semiconductor device 10 shown in FIG. 1.

The memory cell array 200 of the example shown in FIG. 2 is divided into sixteen banks BANK0 to BANK15. A row decoder circuit (e.g., row decoder circuit 12 of FIG. 1; not shown in FIG. 2) may be disposed between adjacent banks and/or in the peripheral circuit region. In the peripheral circuit region, various peripheral circuits and external terminals may be disposed (not shown in FIG. 2).

Figure 3:
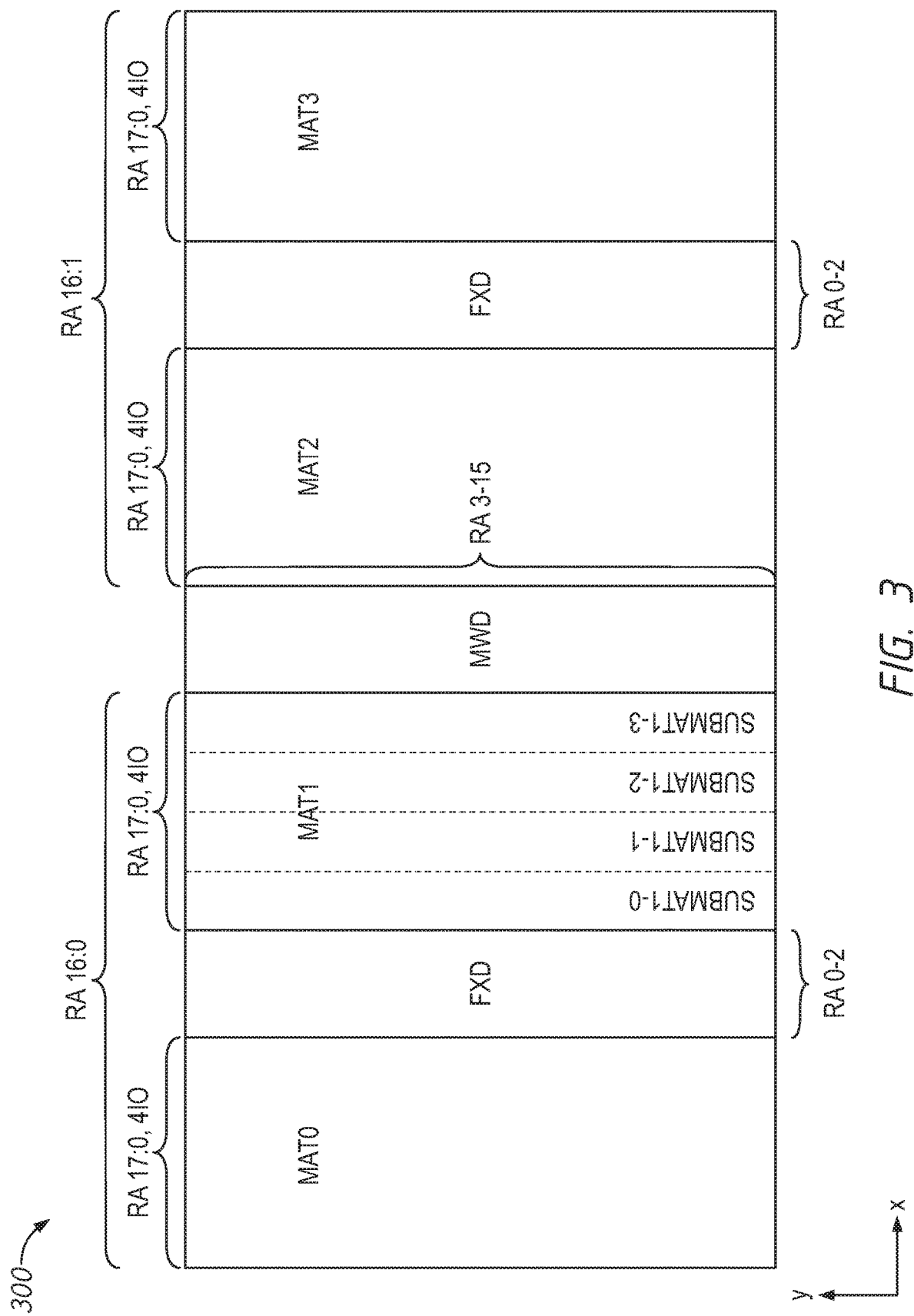
FIG. 3 is a diagram for a configuration of a bank of a memory cell array of a semiconductor device according to an embodiment of the disclosure.

FIG. 3 is a diagram for an example configuration of a bank 300 of a memory cell array according to an embodiment of the disclosure. The banks BANK0 to BANK15 of FIG. 2 may each include the configuration of the bank 300 of FIG. 3 in some embodiments of the disclosure. In some embodiments, the bank 300 may be included in memory cell array 11 of the semiconductor device 10 shown in FIG. 1.

As shown in FIG. 3, the bank 300 includes a plurality of memory mat regions MAT0-3. In the example shown in FIG. 3, the bank 300 has four memory mat regions, but the bank 300 could include more or fewer memory mat regions in other examples. As indicated by the dotted lines in memory mat region MAT1, each memory mat region may be divided into multiple sub-regions SUBMAT1-0-3. While the example shown in FIG. 3 includes four sub-regions, memory mat regions MAT0-3 may include more or fewer sub-regions in other examples. Each sub-region SUBMAT1-0-3 may include a plurality of memory mats (e.g., 32, 64, 128) aligned in the Y-direction. In some embodiments, the plurality of memory mats in a sub-region may be further sub-divided into sets. For example, SUBMAT1-0 may include 64 memory mats and the memory mats may be organized into eight sets of eight. For clarity, the individual memory mats are not shown in FIG. 3. The memory mats of each sub-region SUBMAT1-0-3 may be associated with a corresponding IO (e.g., DQ pad) in some embodiments.

The subword driver operations are controlled by a row decoder circuit (not shown in FIG. 3), for example, the row decoder circuit 12 of FIG. 1. When a row address RA is input thereto, the row decoder selects a subword line by activating an appropriate main word driver (MWD) and an appropriate word driver (FXD) indicated by the row address RA. In the example shown in FIG. 3, one block is shown for the main word driver MWD, however, the main word driver MWD block may include a plurality of main word drivers MWDs. Similarly, two blocks are shown for the word drivers FXDs, but each word driver FxD block may include a plurality of word drivers FXDs. For example, if each memory mat region MAT includes four sub-regions and each sub-region includes 64 memory mats, the main word driver MWD block may include 128 MWDs, each configured to activate a corresponding main word line (MWL). Continuing this example, each word driver FxD block may include eight word drivers FXDs, each configured to activate a corresponding word driver line (FXL). In the example shown in FIG. 3, bits 3-15 of the row address RA encode the main word line MWL and bits 0-2 of the row address RA encode the word driver line FXL. However, other encoding schemes may be used.

Figure 4:
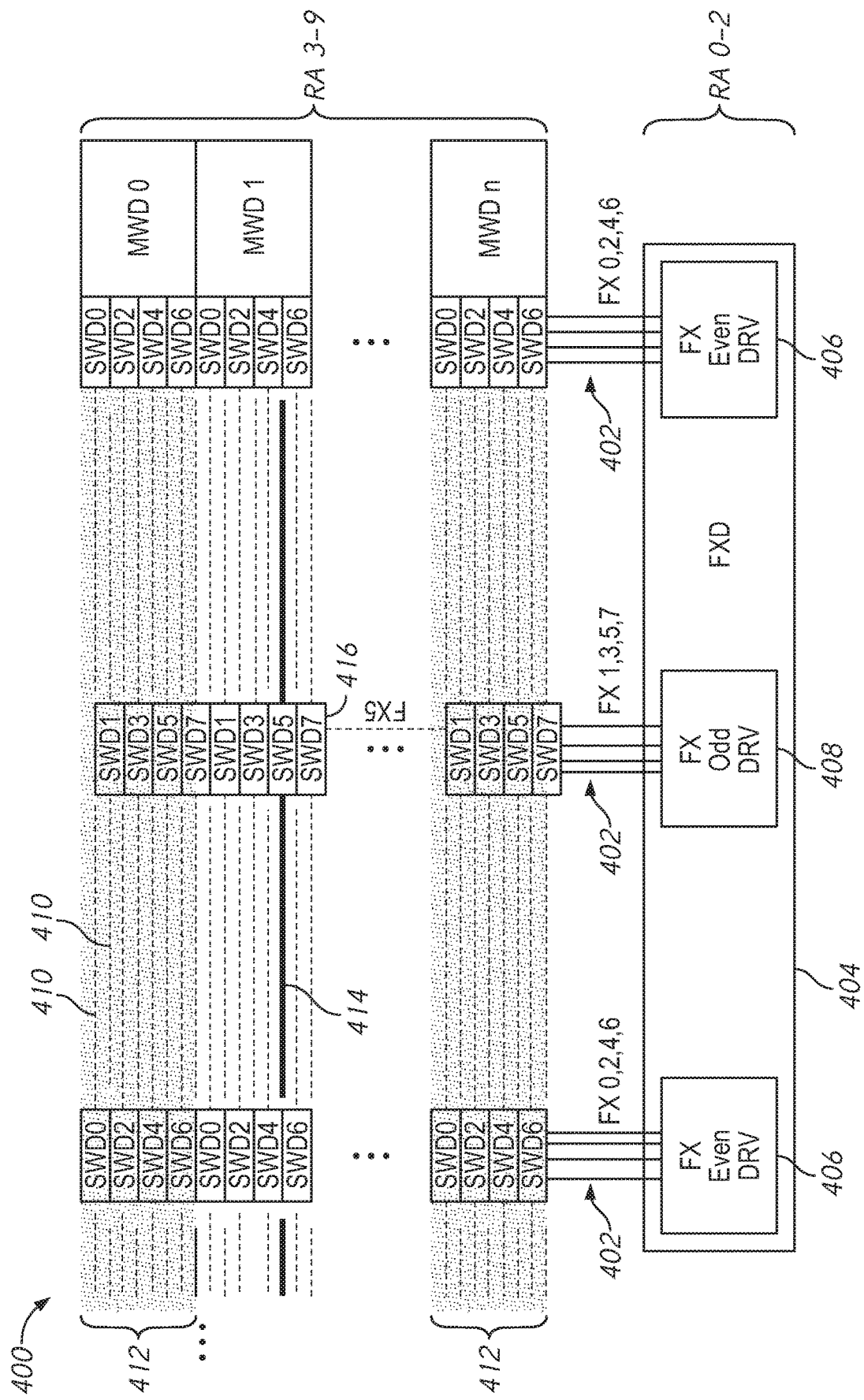
FIG. 4 is a schematic diagram of a portion of a bank of a memory cell array according to an embodiment of the disclosure.

FIG. 4 is a schematic diagram of a portion of a bank 400 according to an embodiment of the disclosure. In some embodiments of the disclosure, the portion of the bank 400 shown in FIG. 4 may be included in the bank 300 of FIG. 3, the memory cell array 200 of FIG. 2, and/or the memory cell array 11 of FIG. 1.

The subword lines are adjacent to each other, and driven by subword drivers SWD0-7 of different subword driver groups. Corresponding main word signals (not shown), driving signals FX, and low voltage VKK/Gnd (not shown) are provided to the subword drivers SWD0-7. In some embodiments, the main word signals and the driving signals FX are signals that may be provided by main word drivers MWD0-N and word drivers FXD 404, respectively, based upon the row address RA as described with reference to FIG. 3. The main word drivers MWD0-N and the word drivers FXD 404 may be included with the row decoder circuit, such as row decoder circuit 12 shown in FIG. 1. The main word signal is provided to the subword drivers SWD0-7 over a main word line (not shown in FIG. 4), and the driving signals FX are provided to the subword drivers SWD0-7 over word driver lines 402. Each of the word driver lines may include two signal lines, one to provide the driving signal FXT and the other to provide the driving signal FXF, which may be included in a driving signal FX.

A main word line MWL may extend over array regions of a respective memory mat (e.g., a memory mat in SUBMAT1-0 in FIG. 3) to provide the main word signal to the subword driver groups of the memory mat to activate the subword drivers SWD0-7 of the memory mat. That is, when a main word driver MWD is activated, it may provide active main word signals to all the subword drivers SWD0-7 of the mat. Word driver lines 402 of word driver FXD 404 provides driving signals FX to at least one subword driver SWD in each mat. In the example shown in FIG. 4, the word driver FXD 404 includes even word drivers 406 and odd word drivers 408. The even word drivers 406 provide respective driving signals to even numbered subword drivers SWD0, SWD2, SWD4, and SWD6 of each memory mat and odd word drivers 408 provide respective driving signals to odd numbered subword drivers SWD1, SWD3, SWD5, and SWD7 of each memory mat. However other arrangements may be used in other examples. In the example shown in FIG. 4, each line of the word driver FXD may be coupled to a corresponding subword driver SWD0-7 in each memory mat. For example, FXL 5 may be coupled to the subword driver SWD5 of each memory mat.

In the example operation shown in FIG. 4, a row address RA has indicated MWD1 should be activated (e.g., selected) and odd word driver FXD 408 associated with word driver line FXL 5 should be activated (e.g., selected). As shown by the shaded regions 412, subword lines 410 associated with the main word drivers MWD0, MWDn remain inactive, even the subword lines associated with word driver line FXL 5. However, the subword line 414 driven by subword driver SWD5 416 associated with activated MWD1 and FXL 5 is activated to access memory cells along subword line 414. Thus, a selected subword line SWL of the selected memory mat associated with MWD1 is driven to the high voltage by the corresponding activated subword driver SWD5. In some examples, the other subword drivers SWD of the selected memory mat drive the respective unselected subword lines SWL to an inactive voltage. Subword drivers SWD of unselected memory mats (e.g., memory mats associated with MWD0 and MWDn) remain deactivated, and the subword lines SWL of the unselected memory mats MAT are not provided a voltage in some examples. That is, while a subword driver SWD may be enabled by an active main word driver MWD or an active word driver FXD, in order to be activated, a subword line SWL must be associated with a subword driver SWD coupled to an activated word driver FXD and an activated main word driver MWD. After the memory cells of the selected subword line SWL have been accessed, the selected subword line SWL is then discharged to an inactive voltage by deactivating the MWD and/or FXD as described herein.

During a refresh operation, the activation signals to the main word drivers MWD and word drivers FXD may toggle between active and inactive states (e.g., low and high) as different subword lines SWL are refreshed. The signals provided by the main word drivers MWD and/or word drivers FXD may also be alternately driven between active an inactive states. As previously described, both the MWD and FXD are required to be activated in order to activate a desired SWL. In some embodiments of the disclosure, one of the MWD and the FXD may be held in an active state while the other one of the MWD and FXD is driven between active and inactive states during refreshes of SWLs during the refresh operation. For example, a technique for maintaining driving signals FXT and FXF in active states during multiple refreshes of a refresh operation may include assigning the bits of the row address indicating the word driver FXD (e.g., RA0-2 shown in FIGS. 3 and 4) to the most significant bits and assigning the row address bits indicating the main word drivers MWD (e.g., RA3-9, 10-12 shown in FIGS. 3 and 4) to lesser significant bits. During a refresh operation, a refresh control circuit (such as refresh control circuit 16 shown in FIG. 1) may control the row address. For example, the refresh control circuit may increment through row addresses for each refresh performed during a refresh operation to selectively activate and deactivate the main word drivers MWD and word drivers FXD. With this address scheme, driving signals FXT and FXF may remain active while the main word signals provided by the main word drivers MWD may transition between active and inactive states responsive to the refresh control circuit incrementing through the lesser significant bits of the address signal.

Driving one or both main word signals and the driving signals FXT and FXF between active and inactive states result in current draw and power consumption due to driving between active and inactive voltages. In some embodiments of the disclosure, the inactive voltage for at least one of the main word signals and the driving signals FXT and FXF is a voltage that is between the active voltage and a reference voltage (e.g., ground). For example, in some embodiments of the disclosure, the driving signal FXT may be driven between an active voltage provided by a power supply and an inactive voltage that is between the power supply voltage and the reference voltage. The reference voltage may be used, for example, as an inactive voltage for other signals and circuits. Driving one or both of the main word signals and the driving signals FXT and FXF between an active voltage and an inactive voltage having an intermediate voltage (e.g., between the active voltage and a reference voltage) may reduce current and power consumption during operations, for example, during refresh operations.

Figure 5:
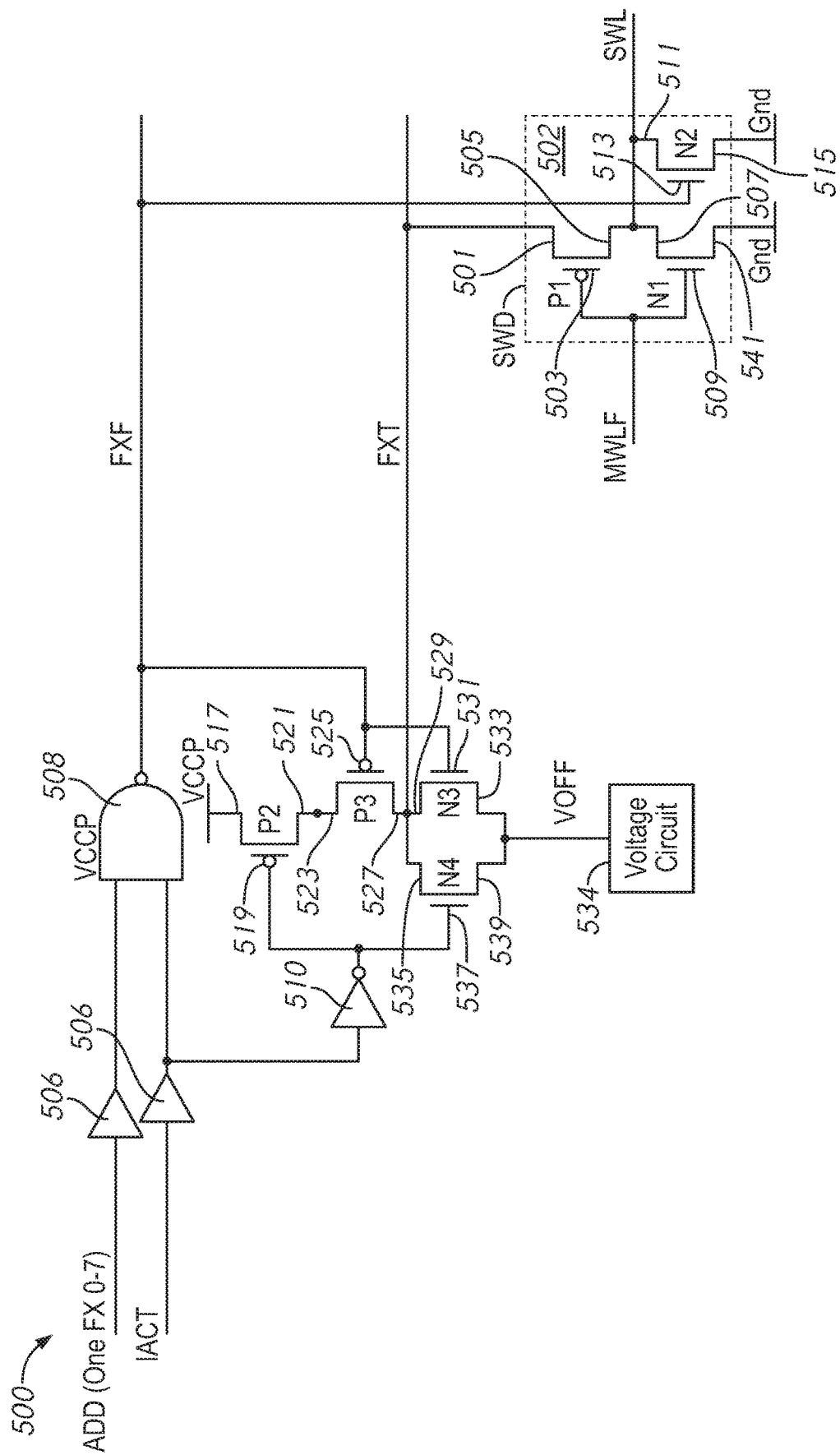
FIG. 5 is a circuit diagram of a word driver according to an embodiment of the disclosure.

FIG. 5 is a circuit diagram of a word driver FXD 500 according to an embodiment of the disclosure. The FXD 500 may be included in word drivers FXD shown in FIG. 3 and/or word drivers 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3. For context, a subword driver SWD 502 associated with the FXD 500 is also shown. The SWD 502 may be included in the subword drivers SWD0-7 shown in FIG. 4 in some embodiments.

Before explaining the details of the FXD 500, the SWD 502 will be described. In the embodiment shown in FIG. 5, the SWD 502 includes a P-channel field effect transistor P1 and N-channel field effect transistors N1 and N2. The transistors P1 and N1 are series-connected to each other at nodes 505 and 507, respectively, and a main word signal MWS is provided to the gate nodes 503 and 509. A driving signal FXT is provided to the node 501 (e.g., drain or source) of the transistor P1, and a reference voltage (e.g., ground) is provided to node 541 (e.g., drain or source) of the transistor N1. While the examples herein describe the reference voltage as ground, other voltages may also be used (e.g., VKK). The nodes 505 and 507 of the transistors P1 and N1 are coupled to subword line SWL. A driving signal FXF is provided to a gate node 513 of the transistor N2, with node 511 (e.g., drain or source) coupled to the subword line SWL, and the reference voltage is provided to node 515 (e.g., drain or source). As previously described, the main word signal MWS is provided by a main word driver MWD, and the driving signals FXT and FXF are provided by FXD 500.

The main word signal MWS is an active low level signal, and the driving signals FXT and FXF are active high level and active low level signals. The driving signals FXT and FXF are complementary signals. When the main word signal MWS and the driving signals FXT and FXF are activated (e.g., MWS and FXF are low and FXT is high), transistors N1 and N2 are not activated, but the transistor P1 is activated to provide the active voltage of the FXT signal to the subword line SWL. For example, the active voltage for the driving signal FXT may be a power supply voltage (e.g., VCCP), which is provided to the subword line SWL when the transistor P1 is activated. In contrast, when the main word signal MWS is in the inactive state (e.g., inactive high level), or either of the driving signals FXT and FXF is also in the inactive state, the corresponding subword line SWL is driven to the reference voltage. While the FXD 500 is shown as providing driving signals FXT and FXF to one subword line driver SWD 502, FXD 500 may provide driving signals to multiple subword drivers, for example, as described in reference to FIGS. 3 and 4.

Returning to the FX driver (e.g., FXD 500), various control signals may be provided to control the operation of the FXD 500. In the example shown in FIG. 5, the FXD 500 receives an address signal ADD and an internal activation signal IACT.

The address signal ADD may be provided by an address decoder circuit, such as address decoder circuit 32 shown in FIG. 1 or a refresh control circuit, such as refresh control circuit 16 shown in FIG. 1. As noted in FIGS. 3 and 4, row address bits RA0-2 may be used to indicate one of eight FX drivers (e.g., FX0-7). FXD 500 may be one of the eight FX drivers in some examples. In some embodiments, RA0-2 may be the most significant bits (MSB) of the row address. Accordingly, during certain operations (e.g., refresh operations) where a counter transitions through sequential row addresses, as address bits RA3-9, 10-12 are counted through, the FX driver indicated by RA0-2 remains selected (e.g., address signal ADD remains in an active state). After address bits RA3-9, 10-12 have been counted through, the address bits RA0-2 may be incremented and the address signal ADD may transition to an inactive state to deselect the current FX driver and a different FX driver may be selected.

The activation signal IACT signal may be provided by a command decoder circuit such as command decoder circuit 34 shown in FIG. 1. The activation signal IACT and the address signal ADD may be provided to level shifters 506 to raise the voltage of the signals to a higher voltage (e.g., VCCP). In some examples, ADD and TACT may be provided at 1.2V and output at 3.1V from the level shifter 506. ADD and IACT may be provided to a driving signal driver 508 that outputs driving signal FXF. FXF remains in an inactive state (e.g., inactive high level) unless both ADD and IACT are high. In some embodiments of the disclosure, the driving signal driver 508 may include a NAND gate, as shown in FIG. 5. Additional and/or alternative circuits may be used in other embodiments of the disclosure.

FXD 500 may also include a driving signal driver that provides the driving signal FXT. The FXT driving signal driver includes the P-channel transistors P2 and P3 and the N-channel transistors N3 and N4. The transistors P2 and P3 are coupled in series at nodes 521 and 523 respectively, where P3 is further coupled in series at node 527 with the transistor N3 at node 529. A node 517 of transistor P2 may be provided a power supply voltage (e.g., VCCP). FXF is provided to the gate 525 of transistor P3 and gate 531 of transistor N3. The nodes 527 and 529 of transistors P3 and N3, respectively, are coupled to a word driver line that provides driving signal FXT. The transistor N4 is coupled in parallel with transistor N3. The gate 519 of transistors P2 and gate 537 of N4 are provided an inverted IACT signal from inverter 510. A voltage circuit 534 coupled to the nodes 533 and 539 of transistors N3 and N4 provides a voltage VOFF. When activated, the transistors N3 and N4 provide the voltage VOFF to the word driver line to drive the signal FXT when in the inactive state. The voltage VOFF is a voltage that is between the active voltage for an active driving signal FXT (e.g., VCCP) and a reference voltage (e.g., ground).

The FXD 500 may operate such that driving signal FXT is driven to the voltage VOFF for an inactive state unless both ADD and IACT are active (e.g., active high). When both ADD and IACT are high, the driving signal driver 508 provides an active FXF signal (e.g., active low). The low FXF signal activates transistor P3 and deactivates N3, and the inverted IACT signal activates transistor P2 and deactivates transistor N4 such that FXT is driven to VCCP. When ADD is low (e.g., FXD 500 is no longer indicated by the address RA0-2), both FXF and FXT will be inactive (e.g., high and low, respectively), regardless of the state of IACT.

During a refresh operation, the activation signal IACT may toggle between active and inactive states (e.g., low and high) for a plurality of refreshes of subword lines of the memory mats. As a result, the FXF and FXT switch between active and inactive states. Providing the voltage VOFF as the inactive voltage for the FXT may reduce current draw and power consumption during the switching compared with providing the reference voltage (e.g., ground) as the inactive voltage for the FXT.

Figure 6:
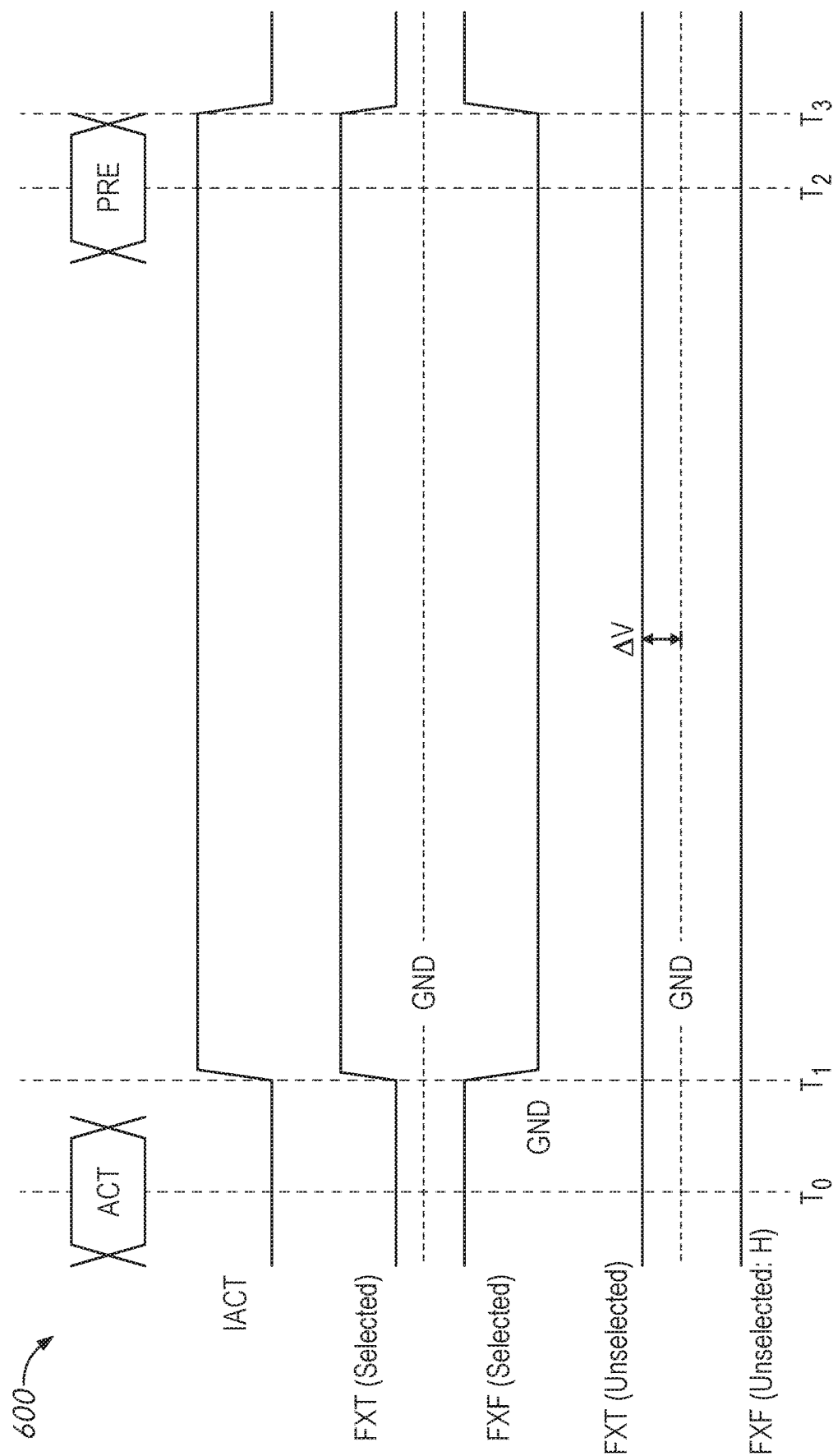
FIG. 6 is a timing diagram of various signals during operation of a driver circuit according to an embodiment of the disclosure.

FIG. 6 is a timing diagram 600 of various signals during an operation of a driver circuit according to an embodiment of the disclosure. In some embodiments of the disclosure, the driver circuit 500 of FIG. 5 may be operated according to the example operation of timing diagram 600. The timing diagram 600 will be described with reference to the driver circuit 500 of FIG. 5. However, the example of FIG. 6 is not limited to the specific embodiment of the FXD 500.

Around time T0, an activation command may be received by a device that includes the driver circuit 500 of FIG. 5, for example, the semiconductor device 10 shown in FIG. 1. Around time T1, an internal activation signal IACT may transition to an active (e.g., high) state indicating active operation of the memory. Driver circuits may be selected when the respective ADD signal is active (e.g., active high). For driver circuits that are selected, the driving signal FXT becomes active, transitioning from an inactive low voltage (e.g., VOFF) to an active high voltage (e.g., VCCP), and the driving signal FXF also become active, transitioning from an inactive high voltage (e.g., VCCP) to an active low voltage (e.g., a reference voltage, for example, ground). For driver circuits that are unselected, for example, the respective ADD signal is inactive (e.g., low), the driving signal FXT remains inactive, staying at an inactive low voltage, and the driving signal FXF also remains inactive, staying at inactive high voltage.

As shown in FIG. 6, the inactive low voltage for FXT is between the active high voltage and the reference voltage. As previously described, the reference voltage may be used as the active low voltage for FXF, as shown in FIG. 6. The inactive low voltage for FXT may be a voltage VOFF. The voltage VOFF may be greater than the reference voltage by a voltage difference deltaV.

Around time T2, a precharge command may be received, which causes the activation signal IACT to transition to an inactive (e.g., low) state at time T3 indicating inactive operation of the memory. As a result, the driver signal driver 508 provides an inactive driving signal FXF, transitioning from the active low voltage to the inactive high voltage. For driver circuits that were selected, the driving signal FXT becomes inactive, transitioning from the active high voltage to the inactive voltage (e.g., VOFF). For driver circuits that are unselected, the driving signal FXT remains inactive, staying at the inactive voltage.

Figure 7:
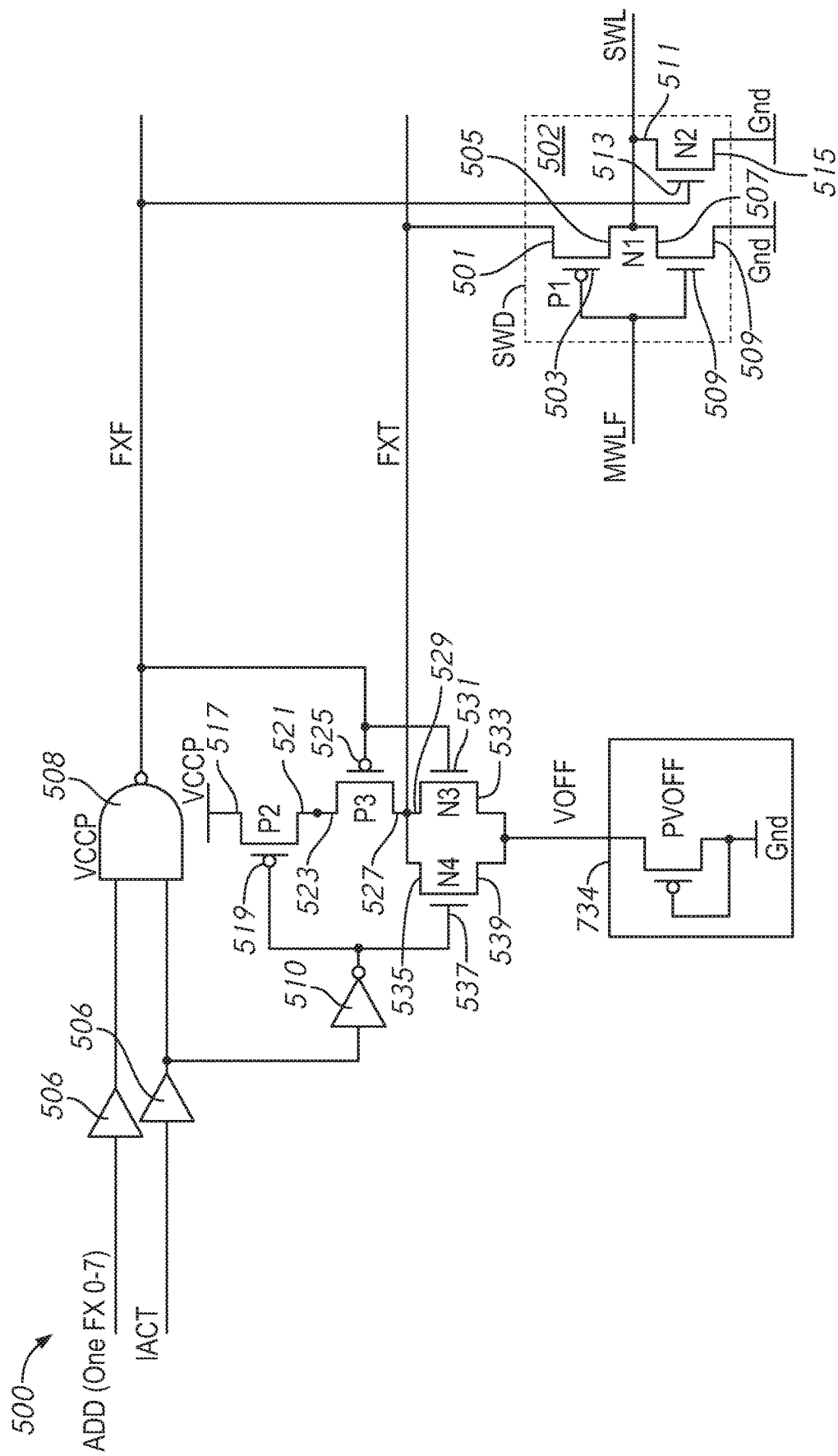
FIG. 7 is a circuit diagram of a word driver according to an embodiment of the disclosure.

FIG. 7 is a circuit diagram of the word driver FXD 500 according to an embodiment of the disclosure. As previously described, the FXD 500 may be included in word drivers FXD shown in FIG. 3 and/or word drivers 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3.

In contrast to the word driver FXD 500 previously described with reference to FIG. 5, the word driver FXD 500 includes a voltage circuit 734. The voltage circuit 734 provides a voltage VOFF that is between an active high voltage (e.g., VCCP) and a reference voltage (e.g., ground). The voltage circuit 734 includes a p-channel field effect transistor PVOFF having gate and drain nodes coupled to a reference voltage (e.g., ground). The diode-coupled transistor PVOFF provides a voltage VOFF based on the threshold voltage VTP of the transistor PVOFF. In some embodiments of the disclosure, the transistor PVOFF may have a threshold voltage VTP equal to the threshold voltage of the transistor P1 of the SWD 502. For example, the transistor PVOFF may be matched to the transistor P1, such as having the same transistor structure and/or dimensions as the transistor P1. In such embodiments, the transistor P1 will remain inactive in the event the precharge voltage becomes greater than the reference voltage (but less than VTP). Thus, inadvertent current conduction may be prevented through the transistor P1.

A voltage circuit such as the voltage circuit 734 provides the voltage VOFF between the active high voltage and the reference voltage using a simple circuit (e.g., diode-coupled transistor) and without using additional voltages to provide the voltage VOFF.

Figure 8:
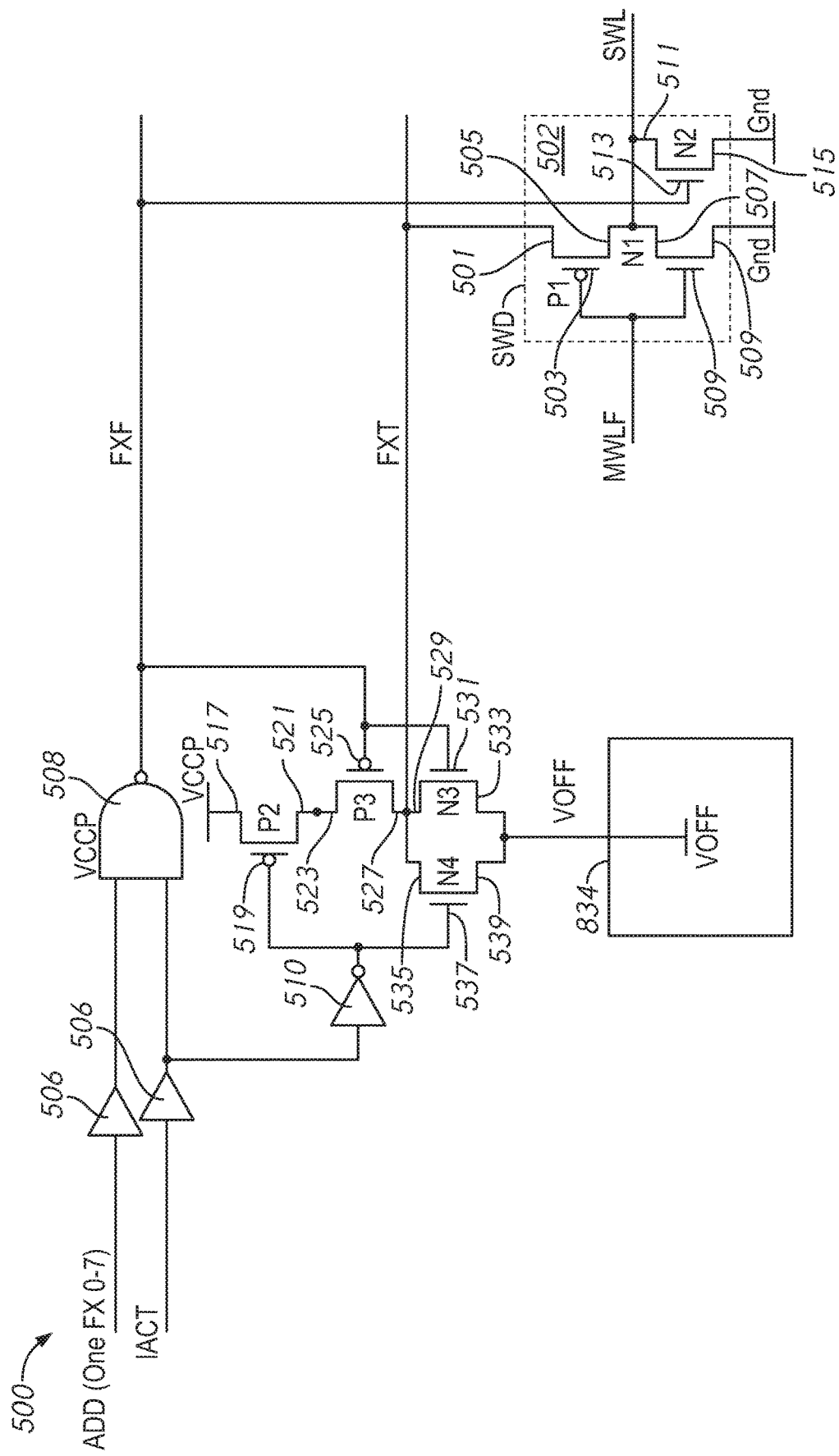
FIG. 8 is a circuit diagram of a word driver according to an embodiment of the disclosure.

FIG. 8 is a circuit diagram of the word driver FXD 500 according to an embodiment of the disclosure. As previously described, the FXD 500 may be included in word drivers FXD shown in FIG. 3 and/or word drivers 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3.

In contrast to the word driver FXD 500 previously described with reference to FIG. 5, the word driver FXD 500 includes a voltage circuit 834. The voltage circuit 834 provides a voltage VOFF that is between an active high voltage (e.g., VCCP) and a reference voltage (e.g., ground). The voltage circuit 834 may receive an internal voltage providing the voltage VOFF to the nodes 533 and 539 of transistors N3 and N4. An internal voltage circuit may provide the internal voltage to the voltage circuit 834. A voltage circuit such as the voltage circuit 834 provides the voltage VOFF between the active high voltage and the reference voltage irrespective of the threshold voltage of the transistor P1 of the SWD 502, and additionally, may provide greater control over the magnitude of the voltage VOFF.

Figure 9:
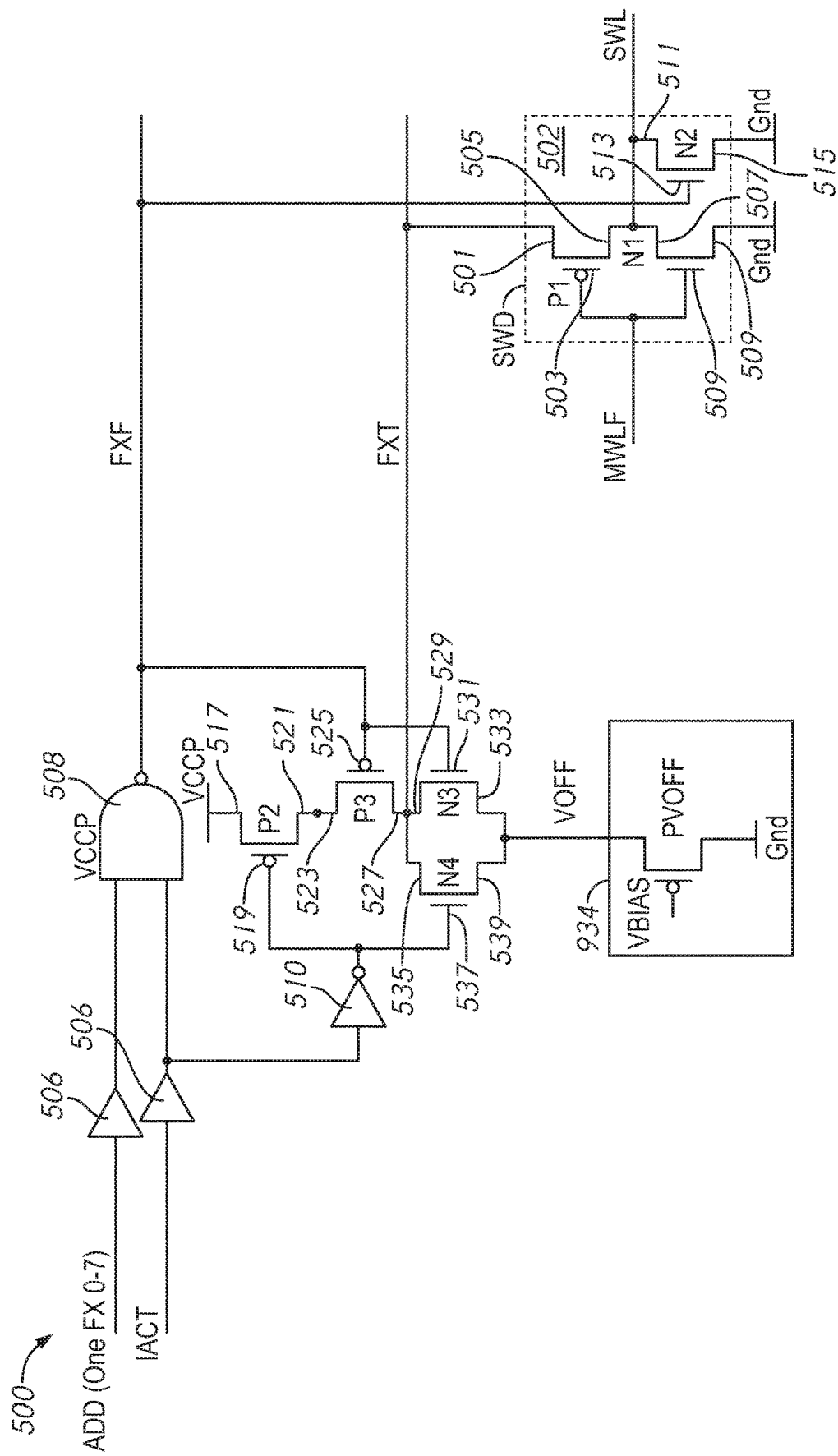
FIG. 9 is a circuit diagram of a word driver according to an embodiment of the disclosure.

FIG. 9 is a circuit diagram of the word driver FXD 500 according to an embodiment of the disclosure. As previously described, the FXD 500 may be included in word drivers FXD shown in FIG. 3 and/or word drivers 404 shown in FIG. 4 in some embodiments. The FXD 500 may be included in a row decoder, such as row decoder 12 in FIG. 1. In some embodiments, FXD 500 may be included in a peripheral region of a memory array, such as memory array 300 shown in FIG. 3.

In contrast to the word driver FXD 500 previously described with reference to FIG. 5, the word driver FXD 500 includes a voltage circuit 934. The voltage circuit 934 provides a voltage VOFF that is between an active high voltage (e.g., VCCP) and a reference voltage (e.g., ground). The voltage circuit 934 includes an p-channel field effect transistor PVOFF. A drain node of the transistor PVOFF is provided the reference voltage and a bias voltage VBIAS is provided to a gate of the transistor PVOFF. The voltage circuit 934 provides a voltage VOFF based on the threshold voltage VTP of the transistor PVOFF and the voltage VBIAS. For example, the voltage VOFF may be the sum of the threshold voltage VTP and the voltage VBIAS. The voltage VBIAS may be provided by an internal voltage circuit.

A voltage circuit such as the voltage circuit 934 provides the voltage VOFF between the active high voltage and the reference voltage without relying on a transistor PVOFF that has a threshold voltage VTP that is the same as the threshold voltage of the transistor P1 of the SWD 502 because the voltage VOFF is also based on the voltage VBIAS.

Figure 10:
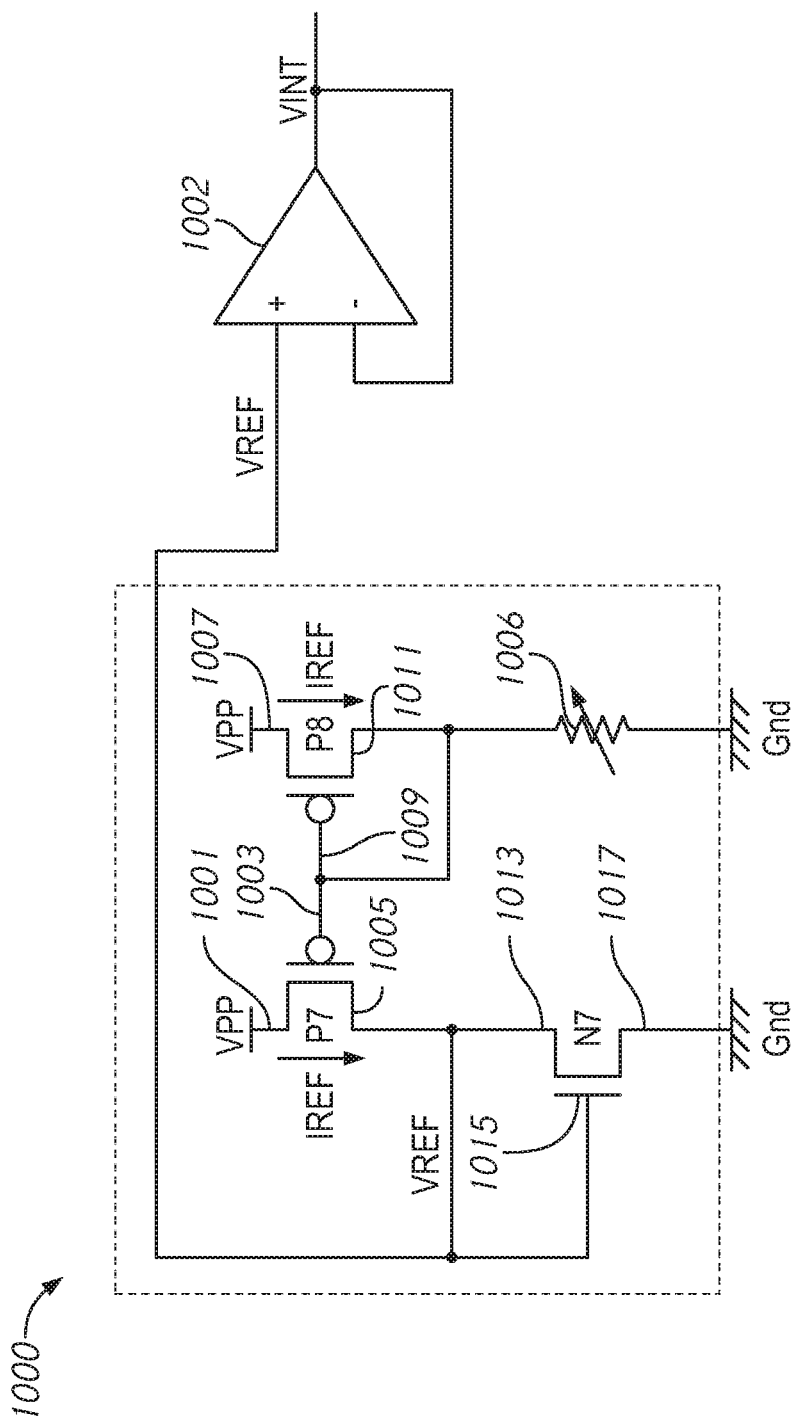
FIG. 10 is an internal voltage circuit according to an embodiment of the disclosure.

FIG. 10 is an internal voltage circuit 1000 according to an embodiment of the disclosure. The internal voltage circuit 1000 may provide an internal voltage VINT. In some embodiments, the internal voltage circuit 1000 may be used to provide the internal voltage for a word driver, for example, to the voltage circuit 534, 734, 834, and/or 934 of the word drivers 500 shown in FIGS. 5, 7, 8, and/or 9.

Internal voltage circuit 1000 may include an operational amplifier (op-amp) 1002, P-channel transistors P7 and P8, N-channel transistor N7, and variable resistance 1006. Transistor P7 may have a node 1001 coupled to a power supply voltage (e.g., VPP) and a node 1005 coupled to a node 1013 of transistor N7. The nodes 1005 and 1013 may be coupled to a gate 1015 of transistor N7. The gate 1015 of transistor N7 and the nodes 1005 and 1013 may also be coupled to a non-inverting input of op-amp 1002. Transistor P8 may also have a node 1007 coupled to the power supply voltage. A gate 1003 of transistor P7 and a gate 1009 of P8 may be coupled to one another. A node 1011 of transistor P8 may be coupled to the gates 1003 and 1009 of transistors P7 and P8, respectively. The node 1011 of transistor P8 may further be coupled to the variable resistance 1006. The variable resistance 1006 may be coupled to a reference voltage (e.g., ground). A node 1017 of transistor N7 may also be coupled to the reference voltage.

In operation, the transistors P7 and P8 may be configured to provide a current mirror with a current IREF across nodes 1001 and 1005 of transistor P7 and nodes 1007 and 1011 of transistor P8. Transistor N7 may receive the current IREF and conduct the current IREF across nodes 1013 and 1017 to ground. As a result, a voltage VREF is provided at node 1013. VREF is provided to op-amp 1002 at the non-inverting input and the op-amp 1002 provides an output voltage VINT that is based on VREF. For example, the output voltage VINT may be equal to the voltage VREF. The output voltage VINT may be fed back into an inverting input of the op-amp 1002. The op-amp 1002 may provide stability to VINT in some embodiments.

The resistance of variable resistance 1006 may be configured and/or adjusted to set a voltage of the internal voltage VINT. As previously described, in some embodiments, the internal voltage circuit 1000 may be configured to provide the internal voltage VINT to a voltage circuit, for example, to the voltage circuit 534, 734, 834, and/or 934 of the word drivers 500 shown in FIGS. 5, 7, 8, and/or 9. For example, in an embodiment of the disclosure where the internal voltage circuit 1000 provides a voltage VOFF for the voltage circuit 834 (FIG. 8), the variable resistance 1006 may be configured and/or adjusted to provide an internal voltage VINT having the desired voltage VOFF. In an embodiment of the disclosure where the internal voltage circuit 1000 provides a voltage VBIAS for the voltage circuit 934 (FIG. 9), the variable resistance 1006 may be configured and/or adjusted to provide an internal voltage VINT having the desired voltage VBIAS.

Other circuits of the internal voltage circuit 1000 may be configured and/or changed to provide a desirable internal voltage VINT. Thus, the example of configuring and/or adjusting the variable resistance 1006 in not intended to be limiting. Additionally, in other embodiments, internal voltage circuits other than internal voltage circuit 1000 may be used to provide an internal voltage to the voltage circuits of the word drivers.

Figure 11:
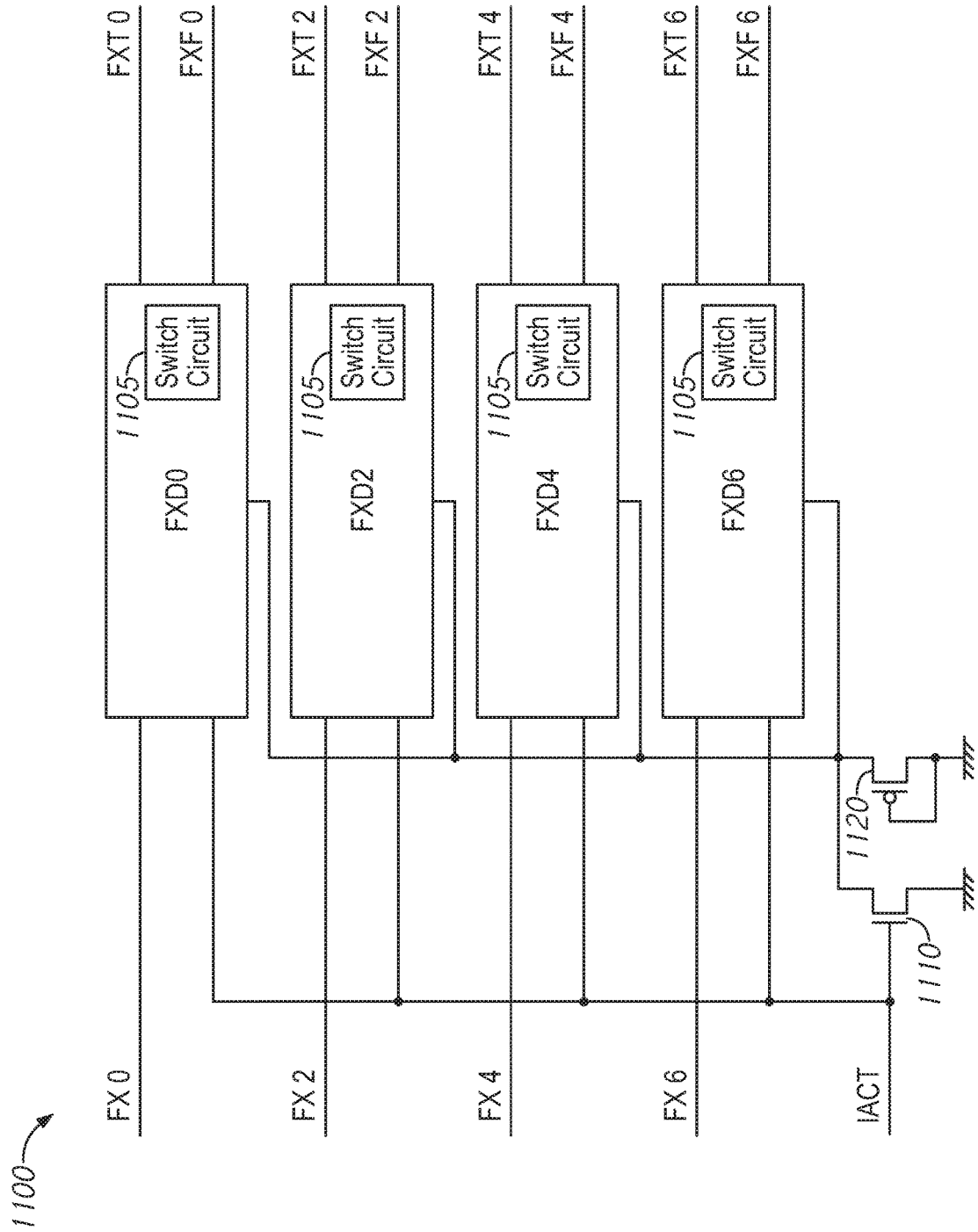
FIG. 11 is a block diagram of a plurality of word drivers according to an embodiment of the disclosure.

FIG. 11 is a block diagram 1100 of a plurality of word drivers (FXD0, FXD2, FXD4, and FXD6) according to an embodiment of the disclosure. Each of the word drivers provides respective driving signals FXT and FXF (e.g., FXT0/FXF0, FXT2/FXF2, FXT4/FXF4, and FXT6/FXF6) having logic states based on a respective driver activation signal FX n and an internal activation signal IACT. The driving signals FXT and FXF are provided by a word driver on respective lines. Subword drivers SWD, for example, may be coupled to the lines on which the driving signals FXT and FXF are provided. The word drivers FXD0, FXD2, FXD4, and FXD6 include a switch circuit 1105 that is coupled to the FXT lines of the word drivers. When the activation signal IACT transitions from active to inactive (e.g., inactive low), the switch circuits 1105 of the word drivers FXD0, FXD2, FXD4, and FXD6 may couple together the lines on which the respective driving signals FXT are provided. As a result, charge on the lines (e.g., from providing active and inactive driving signals FXT) may be shared.

The activation signal IACT is also provided to a transistor 1110 having a source coupled to a reference voltage (e.g., ground) and a drain coupled to the word drivers FXD0, FXD2, FXD4, and FXD6. The transistor 1110 is activated when the activation signal IACT is active (e.g., active high). The activated transistor 1110 provides the reference voltage to the word drivers FXD0, FXD2, FXD4, and FXD6. A precharge circuit 1120 is also coupled to the drain of the transistor 1110 to provide an initial precharge voltage. The precharge circuit 1120 is shown in FIG. 11 as a diode-coupled p-channel field effect transistor. As a result, the initial precharge voltage is based on the threshold voltage of the p-channel transistor. However, in some embodiments of the disclosure, additional and/or alternative circuits may be included in the precharge circuit 1120. While four word drivers are shown in FIG. 11, more or fewer word drivers may be included in other embodiments. In some embodiments, each word driver FXD0, FXD2, FXD4, and FXD6 may include one or more of word drivers FXD 500 shown in FIGS. 5 and 7-9. In such embodiments, the driver activation signal FX n is representative of the address signal ADD described with reference to FIGS. 5 and 7-9.

In operation, when the activation signal IACT is active, a word driver FXD may be selected responsive to an active respective driver activation signal FX n (e.g., active high). Additionally, the transistor 1110 is activated to provide the reference voltage to the word drivers FXDs. The selected word driver(s) FXD provides active driving signals FXT and FXF (e.g., active high FXT and active low FXF). Unselected word driver(s) provide inactive driving signals FXT and FXF (e.g., inactive low FXT and inactive high FXF). When the activation signal IACT transitions to an inactive state following provision of the active driving signals FXT and FXF by a selected word driver(s), the lines on which the word drivers provide the respective driving signals FXT are coupled together by the switch circuit 1105. In this manner, charge on the lines from providing active voltage for an active high FXT and inactive voltage for an inactive low FXT are shared. As a result of the charge sharing, a precharge level for the FXTs provided by the word drivers FXD following deactivation is between the active voltage (e.g., VCCP) and an inactive low voltage (e.g., ground).

In an example operation of the four word drivers FXD0, FXD2, FXD4, and FXD6, and one of the word drivers FXD is selected while the activation signal IACT is active to provide an active high driving signal FXT, when the activation signal IACT transitions to the inactive state, the line providing the active voltage for the active high driving signal FXT (e.g., VCCP) is shared with the other lines providing the inactive voltage for the inactive low driving signals FXT (e.g., ground). The resulting voltage level of the lines may be greater than one-fourth VCCP. When the one-fourth VCCP is greater than the threshold voltage of the transistor P1 of the SWD 502, the transistor 1120 may lower the resulting voltage level of the lines to avoid a leakage current at the transistor P1 of the SWD 502. On the other hand, when the one-fourth VCCP is lower than the threshold voltage of the transistor P1 of the SWD 502, the transistor 1120 may be disabled or excluded. The resulting voltage level is greater than one-fourth VCCP because the FXT line of the selected FXD is coupled to a corresponding subword line and the FXT lines of the unselected FXDs are not coupled to a respective subword line. As a result, for the selected FXD the capacitance of the selected FXT line and corresponding subword line is considered, whereas for the unselected FXDs the capacitance of only the unselected FXT lines are considered (e.g., each lower in capacitance than the selected FXT line and corresponding subword line).

While FIG. 11 depicts charge sharing among word drivers FXD0, 2, 4 and 6, it is appreciated that a similar charge sharing may occur between word drivers FXD1, 3, 5 and 7. In addition, in an example where the word drivers FXD0-7 are all placed together (e.g., adjacent one another), then all of the word drivers FXD0-7 may collectively share the charge, with the resulting voltage level being one-eighth VCCP. When a group of FXD0, 2, 4 and 6 and another group of FXD1, 3, 5 and 7 are provided separately, a charge, for instance, in FXD6 is shared with FXD0, 2 and 4, however is not shared with FXD1, 3, 5 and 7. Thus, in this example, a voltage level of FXTs of FXD1, 3, 5 and 7 may become a reference voltage level (e.g., VSS) because no charge is shared. On the other hand, a voltage level of the FXTs of FXD0, 2, 4 and 6 may become the intermediate level due to the charge sharing.

The word drivers FXD0, FXD2, FXD4, and FXD6 sharing charge to provide one or more of the driving signals (e.g., FXT) at a precharge voltage between the active high voltage (e.g., VCCP) and the inactive low voltage (e.g., ground) may reduce current and power consumption during operations, for example, during refresh operations.

Figure 12:
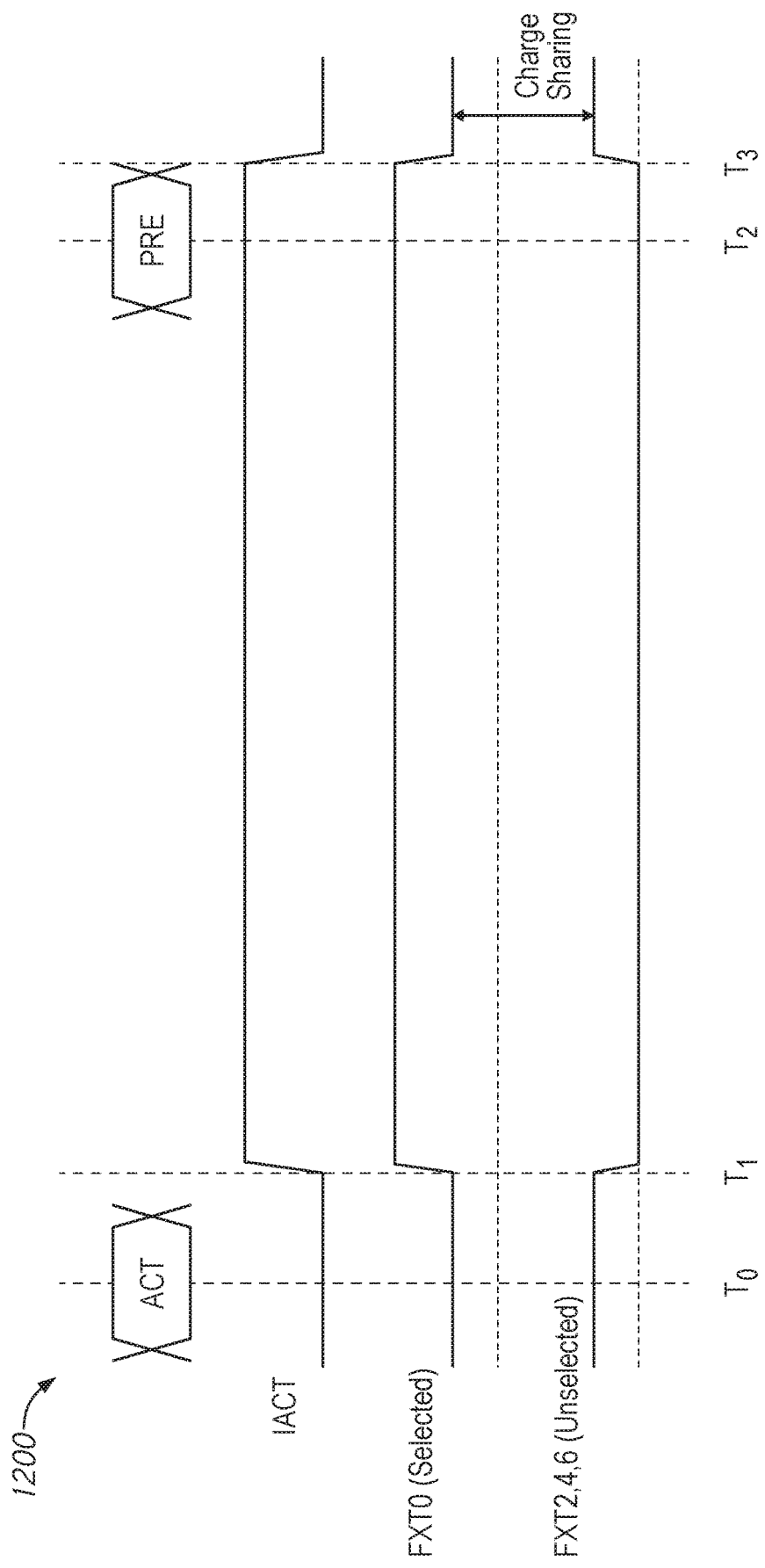
FIG. 12 is a timing diagram of various signals during an operation of a plurality of word driver circuits according to an embodiment of the disclosure.

FIG. 12 is a timing diagram 1200 of various signals during an operation of a plurality of word driver circuits according to an embodiment of the disclosure. In some embodiments of the disclosure, the word driver of FIG. 11 may be operated according to the example operation of timing diagram 1200. The timing diagram 1200 will be described with reference to the word driver of FIG. 11. However, the example of FIG. 12 is not limited to the specific embodiment of the FXDs 1100.

Around time T0, an activation command may be received by a device that includes the driver circuits of FIG. 11, for example, the semiconductor device 10 shown in FIG. 1. Around time T1, an internal activation signal IACT may transition to an active (e.g., high) state indicating active operation of the memory. Additionally, one or more of the word drivers FXD0, FXD2, FXD4, and FXD6 are selected. For example, the respective driver activation signal FX signal for one or more of the word drivers is active (e.g., high). The remaining word drivers remain unselected. For example, the respective driver activation signals FX for the remaining word drivers remain inactive (e.g., low). In the example operation of FIG. 12, the word driver FXD0 is selected, and the word drivers FXD2, FXD4, and FXD6 remain unselected. For selected word driver FXD0, the driving signal FXT0 becomes active, transitioning from an initial precharge voltage (e.g., provided by a precharge circuit, such as precharge circuit 1120) to an active high voltage (e.g., VCCP). For the unselected word drivers FXD2, FXD4, and FXD6, the driving signals FXT2, FXT4, and FXT6 transition from the precharge voltage to an inactive low voltage (e.g., ground).

Around time T2, a precharge command may be received, which causes the activation signal IACT to transition to an inactive (e.g., low) state at time T3 indicating inactive operation of the memory. As previously described with reference to FIG. 11, the inactive activation signal IACT causes the plurality of word drivers FXD0, FXD2, FXD4, and FXD6 to couple together the lines providing the respective driving signals FXT0, FXT2, FXT4, and FXT6. As a result, the charge of the line providing the active FXT and the lines providing the inactive FXTs are shared to provide a precharge voltage that is between the active high voltage and the inactive low voltage.

As previously described, sharing charge to provide one or more of the driving signals (e.g., FXT) at a precharge voltage between the active high voltage (e.g., VCCP) and the inactive low voltage (e.g., ground) may reduce current and power consumption during operations, for example, during refresh operations.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a subword line coupled to a plurality of memory cells;
a word driver circuit configured to provide a first driving signal and a second driving signal, the first driving signal has a first voltage when in an active state and has an intermediate voltage when in an inactive state, and the second driving signal has a second voltage when in an active state and has the first voltage when in an inactive state, wherein the intermediate voltage is between the first voltage and the second voltage;
a subword driver circuit coupled to the subword line and the word driver circuit, the subword driver circuit configured to receive the first driving signal and the second driving signal and drive the subword line based on the first driving signal.

2. The apparatus of claim 1 wherein the word driver circuit comprises:
a voltage circuit coupled configured to provide the intermediate voltage; and
a transistor coupled to the voltage circuit and to a first signal line on which the first driving signal is provided, the transistor configured to provide the intermediate voltage to the first signal line when activated.

3. The apparatus of claim 2 wherein the voltage circuit comprises a diode-coupled transistor coupled to the transistor and to a reference voltage.

4. The apparatus of claim 3 wherein subword driver comprises a second transistor coupled to the first signal line and to the subword line, wherein the diode-coupled transistor is matched to the second transistor.

5. The apparatus of claim 3 wherein the diode-coupled transistor comprises a diode-coupled p-channel transistor.

6. The apparatus of claim 2 wherein the voltage circuit is provided the intermediate voltage by an internal voltage circuit.

7. The apparatus of claim 2 wherein the voltage circuit comprises a second transistor coupled to the transistor and having a gate configured to receive a bias voltage, wherein the intermediate voltage is the sum of the bias voltage and a threshold voltage of the second transistor.

8. The apparatus of claim 1 wherein the first voltage is a power supply voltage and the second voltage is ground.

9. The apparatus of claim 1 wherein the first driving signal is complementary to the second driving signal.

10. A method, comprising:
driving a first driving signal between active and inactive states; and
driving a second driving signal between active and inactive states,
wherein the active state of the first driving signal and the inactive state of the second driving signal correspond to a power supply voltage,
wherein the active state of the second driving signal corresponds to a reference voltage, and
wherein the inactive state of the first driving signal corresponds to an intermediate voltage between the power supply voltage and the reference voltage.

11. The method of claim 10 wherein the intermediate voltage is provided by a diode-coupled transistor.

12. The method of claim 10 wherein the intermediate voltage is a sum of a bias voltage and a threshold voltage of a transistor.

13. The method of claim 10 wherein the intermediate voltage is provided by an internal voltage circuit.

14. The method of claim 10 wherein driving the first driving signal between active and inactive states comprises coupling together signal lines on which a plurality of first driving signals are provided to provide the intermediate voltage when the first driving signals have the inactive state.

* * * * *